United States Patent
Van Der Heijden et al.

(10) Patent No.: US 8,648,997 B2
(45) Date of Patent: Feb. 11, 2014

(54) MEMBER WITH A CLEANING SURFACE AND A METHOD OF REMOVING CONTAMINATION

(75) Inventors: Marcus Theodoor Wilhelmus Van Der Heijden, Dilsen-Stokkem (BE); Mark Drewes Boerema, Steensel (NL); Matthias Ruhm, Dresden (DE); Mario Putz, Dresden (DE)

(73) Assignee: ASML Netherlands B.V., Veldhoven (NL)

( * ) Notice: Subject to any disclaimer, the term of this patent is extended or adjusted under 35 U.S.C. 154(b) by 698 days.

(21) Appl. No.: 12/629,691

(22) Filed: Dec. 2, 2009

(65) Prior Publication Data

US 2010/0141910 A1    Jun. 10, 2010

Related U.S. Application Data

(60) Provisional application No. 61/193,508, filed on Dec. 4, 2008.

(51) Int. Cl.
G03B 27/52    (2006.01)
G03B 27/58    (2006.01)
G03F 7/20    (2006.01)

(52) U.S. Cl.
CPC ........ *G03F 7/70925* (2013.01); *G03F 7/70908* (2013.01); *G03F 7/70341* (2013.01); *G03F 7/70716* (2013.01)
USPC ......... 355/30; 134/8; 355/53; 355/72; 355/77

(58) Field of Classification Search
CPC ............ G03F 7/70925; G03F 7/70908; G03F 7/70341; G03F 7/70716
USPC ........... 355/30, 53, 72, 77; 134/18; 356/237.3
See application file for complete search history.

(56) References Cited

U.S. PATENT DOCUMENTS

| | | | |
|---|---|---|---|
| 4,509,852 A | | 4/1985 | Tabarelli et al. |
| 6,307,620 B1 * | | 10/2001 | Takabayashi et al. .......... 355/72 |
| 2002/0008864 A1 * | | 1/2002 | Kondo ............................ 355/72 |
| 2004/0136494 A1 | | 7/2004 | Lof et al. |
| 2004/0207824 A1 | | 10/2004 | Lof et al. |
| 2005/0030511 A1 * | | 2/2005 | Auer-Jongepier et al. ..... 355/72 |
| 2006/0033892 A1 * | | 2/2006 | Cadee et al. .................... 355/30 |
| 2006/0038968 A1 | | 2/2006 | Kemper et al. |

(Continued)

FOREIGN PATENT DOCUMENTS

| | | |
|---|---|---|
| EP | 1 420 300 A2 | 5/2004 |
| JP | 2004-063669 | 2/2004 |
| JP | 2006-064495 | 3/2006 |
| JP | 2006-187680 | 7/2006 |

(Continued)

OTHER PUBLICATIONS

Japanese Office Action mailed Oct. 19, 2011 in corresponding Japanese Patent Application No. 2009-270949.

(Continued)

*Primary Examiner* — Steven H Whitesell Gordon
(74) *Attorney, Agent, or Firm* — Pillsbury Winthrop Shaw Pittman LLP

(57) ABSTRACT

A member with a cleaning surface for use in capturing particles in a lithographic apparatus is disclosed. The particles are captured by a plurality of projections which are arranged in a pattern. A sensor can be used to detect contaminant particles in the pattern.

23 Claims, 5 Drawing Sheets

(56) References Cited

U.S. PATENT DOCUMENTS

| | | | |
|---|---|---|---|
| 2006/0072085 A1* | 4/2006 | Compen et al. | 355/30 |
| 2006/0103832 A1* | 5/2006 | Hazelton et al. | 355/72 |
| 2006/0119809 A1 | 6/2006 | Verhagen et al. | |
| 2006/0221319 A1* | 10/2006 | Yamaguchi et al. | 355/55 |
| 2007/0076197 A1* | 4/2007 | Koga | 356/237.3 |
| 2007/0138414 A1* | 6/2007 | Stevens et al. | 250/504 R |
| 2008/0131817 A1 | 6/2008 | Yoon et al. | |
| 2008/0212046 A1 | 9/2008 | Riepen et al. | |
| 2009/0014030 A1 | 1/2009 | De Jong et al. | |
| 2010/0175716 A1* | 7/2010 | Sugo et al. | 134/6 |
| 2010/0296068 A1* | 11/2010 | Shibazaki | 355/30 |

FOREIGN PATENT DOCUMENTS

| | | |
|---|---|---|
| JP | 2007-103658 | 4/2007 |
| JP | 2010-103363 | 5/2010 |
| KR | 10-2005-0063312 | 6/2005 |
| WO | WO 99/49504 A1 | 9/1999 |
| WO | WO 2005/064405 A2 | 7/2005 |
| WO | WO 2008/018251 A1 | 2/2008 |

OTHER PUBLICATIONS

U.S. Appl. No. 61/071,621, filed May 8, 2008, Direcks et al.
U.S. Appl. No. 61/136,380, filed Sep. 2, 2008, Tanasa et al.

* cited by examiner

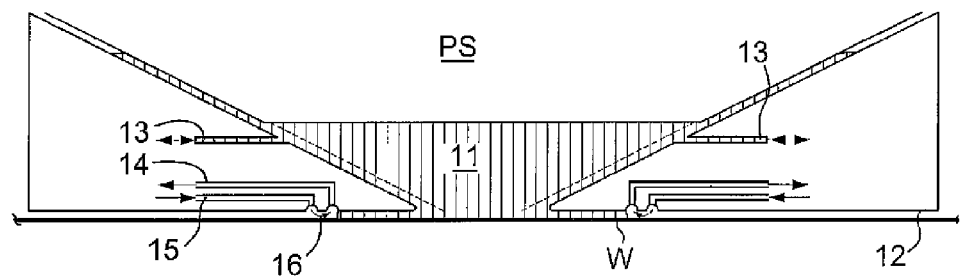
Fig. 5
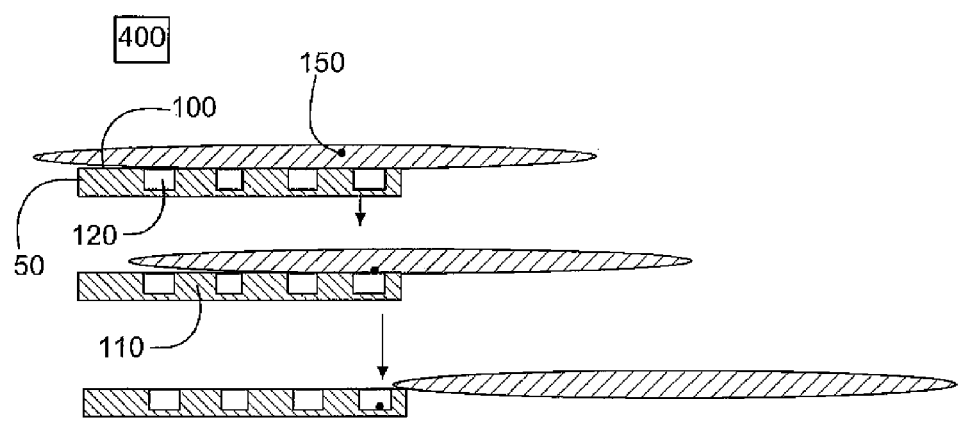
Fig. 6
Fig. 7
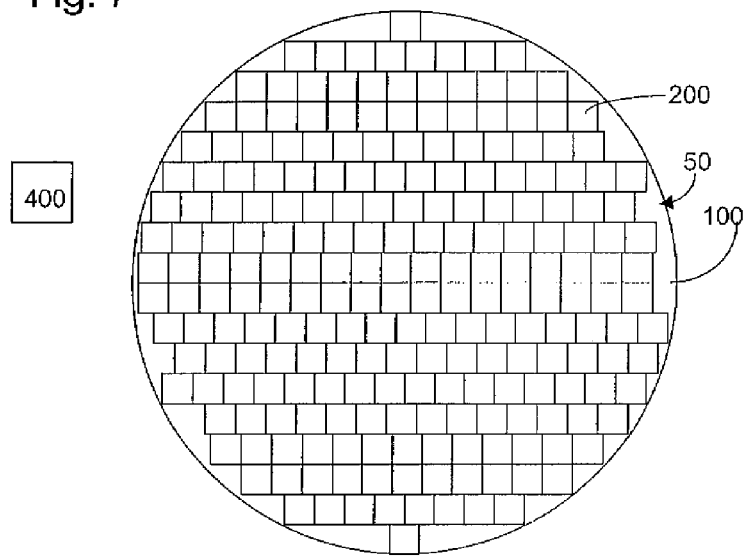

MEMBER WITH A CLEANING SURFACE AND A METHOD OF REMOVING CONTAMINATION

This application claims priority and benefit under 35 U.S.C. §119(e) to U.S. Provisional Patent Application No. 61/193,508, entitled "A Member With A Cleaning Surface and A Method Of Removing Contamination", filed on Dec. 4, 2008. The content of that application is incorporated herein in its entirety by reference.

FIELD

The present invention relates to a member with a cleaning surface and to a method of removing contamination.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a fluid confinement structure (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate W, preferably along the direction of movement of the substrate W relative to the final element, and is removed by at least one outlet after having passed under the projection system PS. That is, as the substrate W is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Note that the direction of flow of the liquid is shown by arrows in FIGS. 2 and 3.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

SUMMARY

The presence of contaminant particles in immersion liquid is to be avoided. Any contaminant particles in the immersion liquid may find their way into the immersion space which is between the final element of a projection system and the substrate. Contaminant particles in the immersion space can lead to imaging errors and their presence is to be avoided.

It is desirable, for example, to provide a member to capture contaminant particles and which allows the contaminant particles to be detected.

According to an aspect, there is provided a member with a cleaning surface for use in capturing particles in a lithographic apparatus, the cleaning surface comprising a plurality of projections to capture contaminant particles therebetween, wherein the projections are arranged in a pattern to enable a sensor of the lithographic apparatus to detect contaminant particles on the cleaning surface.

According to an aspect, there is provided a method of removing contamination from a fluid at least partly contained within a lithography apparatus, the method comprising: loading a member comprising a cleaning surface into the apparatus; bringing the member into proximity with the fluid from which contamination is to be removed, such that contamination is captured by the surface; and using a sensor in the apparatus to detect contamination particles on the cleaning surface.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a further liquid supply system for use in a lithographic projection apparatus;

FIG. 6 is a schematic illustration, in cross-section, of a member with a cleaning surface according to an embodiment of the invention;

FIG. 7 is a schematic illustration, in plan, of a cleaning surface according to an embodiment of the invention;

DETAILED DESCRIPTION

Figure 1:
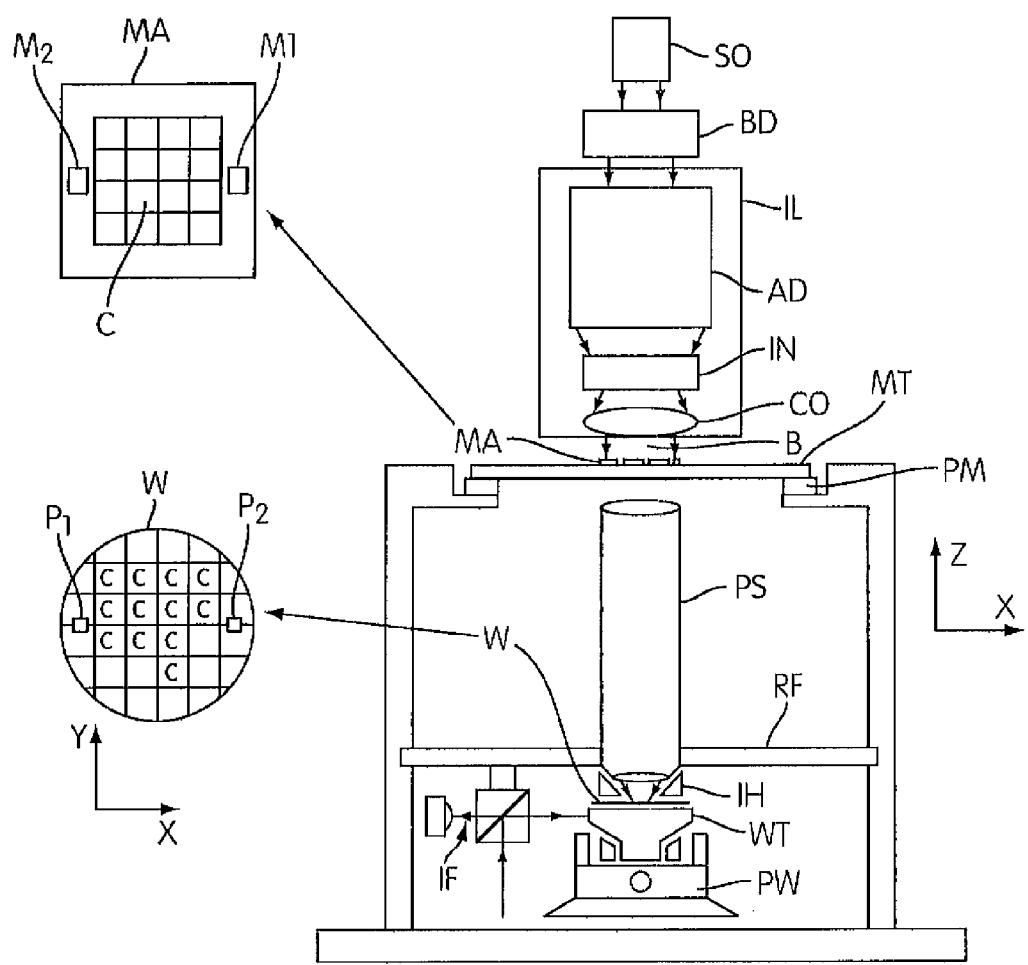
FIG. 1 depicts a lithographic apparatus according to an embodiment of the invention.
Figure 2:
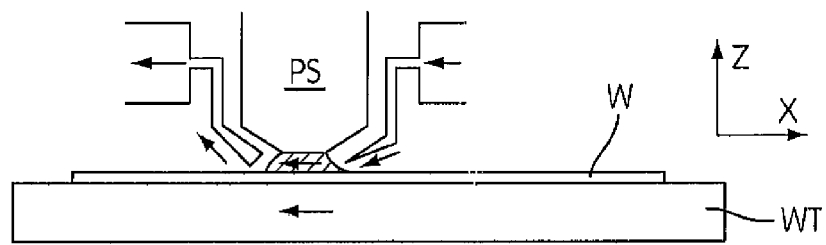
FIGS. 2 and 3 depict a liquid supply system for use in a lithographic projection apparatus.
Figure 3:
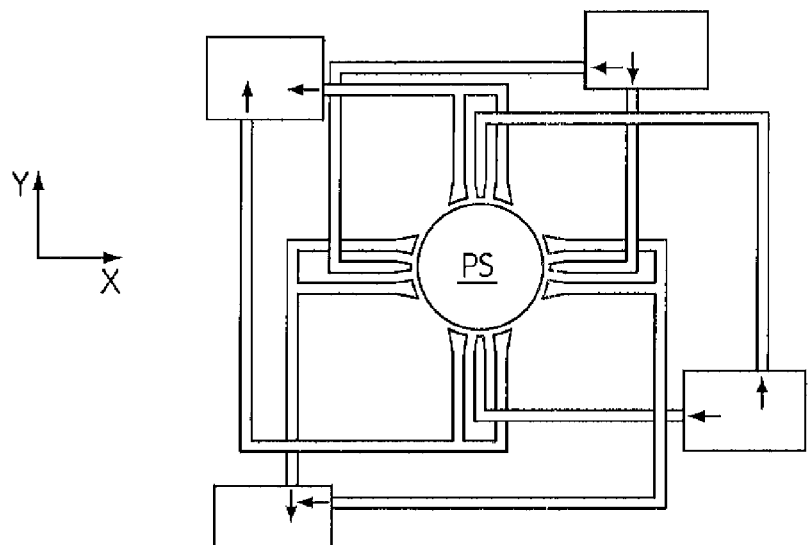
Figure 4:
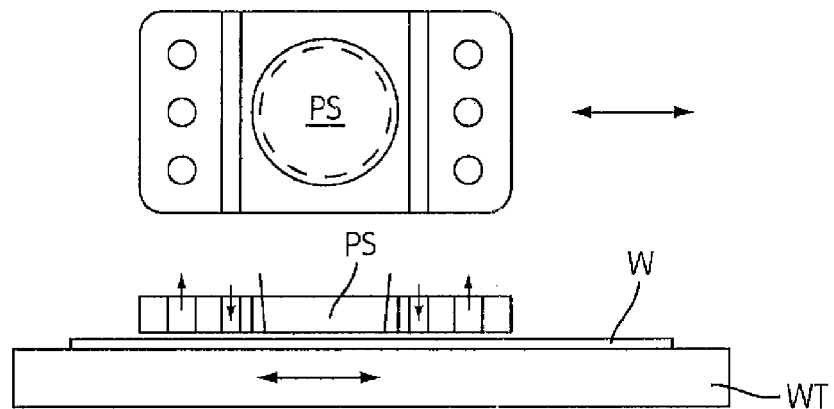
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement in which substantially the whole of the substrate and optionally part of the substrate table is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Another arrangement which has been proposed is to provide the liquid supply system with a fluid confinement structure which extends along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). A seal is formed between the liquid confinement and the surface of the substrate. In an embodiment, a seal is formed between the fluid confinement structure and the surface of the substrate and may be a contactless seal such as a gas seal. Such a system is disclosed in United States patent application publication no. US 2004-0207824.

FIG. 5 schematically depicts a localized liquid supply system or fluid handling structure with a barrier member or fluid confinement structure 12, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a gas seal or fluid seal.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in United States patent application publication no US 2006-0038968. In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 μm. In an embodiment, the porous material is at least slightly liquidphilic (e.g., hydrophilic), i.e. having a contact angle of less than 90° to the immersion liquid, e.g. water. Another arrangement which is possible is one which works on a gas drag principle. The so-called gas drag principle has been described, for example, in United States patent application publication no. US 2008-0212046 and U.S. patent application No. U.S. 61/071,621 filed on 8 May 2008. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application No. 61/136,380 filed on 2 Sep. 2008.

As mentioned above, a problem encountered in lithography is contamination. The reduction and, where possible, the elimination of contamination of a part of the lithographic apparatus is desirable. For example, a reduction in contamination of elements of the lithographic apparatus may reduce the number of defects in a pattern or plurality of patterns projected onto a substrate. Ever decreasing wavelengths of radiation used to apply patterns to substrates means that contamination having smaller dimensions becomes even more of a problem. According to an embodiment of the present invention, a way to reduce the contamination of a part of the lithographic apparatus is to employ a member with a cleaning surface which has been specially treated and/or designed to remove contamination from the lithographic apparatus. Such a cleaning surface may be passed through the lithographic apparatus (for example, apparatus to project radiation onto a substrate, a coating module, an oven, or any other apparatus used in a lithographic process) to reduce the contamination of the lithographic apparatus. Such a cleaning member may be particularly useful for reducing contamination in a lithographic apparatus which employs an immersion fluid.

Contamination may be more prevalent in immersion lithography due to the nature of the processes involved. For example, it can be seen from FIG. 1 that a fluid confinement structure IH at least partly retains an immersion fluid between the projection system PS and the substrate W. Pressure is exerted on the top-side of a substrate W (that is, the side of a substrate W which is provided with, among other possible layers, a layer of resist) by the fluid confinement structure IH and the immersion fluid which it retains. This pressure can cause part of the resist and/or other layer deposited on the substrate W to become loose, and even flake off. This can result in contamination of the fluid confinement structure IH and/or the immersion fluid, possibly reducing the effectiveness of both.

FIG. 6 depicts a member 50 with a cleaning surface 100 according to an embodiment of the invention. The member is for use in capturing particles in a lithographic apparatus. The cleaning surface 100 comprises a plurality of projections 110. There are recesses 120 between adjacent projections 110. When the member 50 comprising the cleaning surface 100 is loaded into the apparatus, the member 50 is brought into proximity with fluid from which contamination is to be removed. In FIG. 6 contaminant particles 150 are indicated. As can be seen, the cleaning surface 100 captures the particles 150. The particles may be attracted by Van der Waals forces, by gravity, etc. This is done by the contaminant particles 150 moving into the recesses 120 between adjacent projections 110. Thereby the particles 150 are trapped in the recesses 120. The fluid from which contaminant particles 150 are captured may be gas and/or liquid.

The projections 110 are formed in a pattern to enable a sensor 400 of the lithographic apparatus to detect contaminant particles 150 on the cleaning surface 100. This is advantageous because it allows monitoring of the level of contamination and/or of the extent of cleaning, for example.

The type of pattern and type of sensor for which the pattern is suited will be described below. A member 50 with a cleaning surface 100 can be provided on any of many different articles in a lithographic apparatus. These will be described first.

In an embodiment the cleaning surface 100 is provided on a member 50 which is shaped and dimensioned so as to be suitable for handling by a lithographic apparatus. In an embodiment the member 50 is shaped and dimensioned so as to be suitable for being placed on a substrate table WT of a lithographic apparatus. For example, the member 50 may be similar in shape and dimension to a standard substrate. The member 50 is standard in that it is substantially the same width as those substrates which may be covered with a layer of resist and patterned using the lithographic apparatus of FIG. 1 (e.g. the substrates may be, for example, a 200 mm or 300 mm in diameter wafer substantially cylindrical in shape). The cleaning surface 100 may be defined on a substrate. The substrate serves as a rigid support layer. The member 50 may be formed of the same material as a standard substrate and the projections 110 and recesses 120 may be formed therein by etching using a photolithographic process. The member 50 may be formed of $SiO_2$.

FIG. 7 is a schematic illustration, in plan, of a member according to an embodiment of the present invention which is sized and dimensioned to be similar to a standard substrate as described above. A plurality of patterns 200 each comprising a plurality of projections 110 and recesses 120 are defined in the cleaning surface 100. Each pattern 200 is such that a sensor 400 of the lithographic apparatus may detect contaminant particles on the surface. In an embodiment the sensor 400 may quantify the amount of contamination on the pattern 200. That is, the sensor 400 may determine how much or many contaminant particles 150 have been collected in the pattern 200.

The pattern 200 may be the same or similar to a pattern used on a substrate which is to be imaged for x-y alignment between the patterning device MA and the substrate W (i.e. for positional measurement in a plane substantially parallel to the cleaning surface 100). Alternatively or additionally, the pattern 200 may be a pattern used to help ensure that a patterned beam PB is focused correctly on the top surface of a substrate W (i.e. for z position or the distance of a sensor from the cleaning surface 100, the z direction being parallel to the optical axis of the projection system PS and perpendicular to the cleaning surface 100). In other words, the pattern 200 may be used by a sensor 400 which sensor has another purpose in the lithographic apparatus. However, other sensors 400 may be used which have no other purpose in the apparatus, and an appropriate pattern may be defined (for example by etching) on the cleaning surface 100 of the member 50.

The difference between a standard substrate for imaging and a member according to an embodiment of the present invention is that the patterns 200 cover substantially the whole of the top surface of the member 50. In one embodiment, at least 20% of the top surface of the member 50 is covered by patterns 200. In another embodiment, at least 30, 50 or 75% of the top surface of the member 50 is covered by patterns 200. The member 50 is not an intermediate product. The patterns 200 are not only formed in scribe lines. In an embodiment there are no devices formed on the member 50. In an embodiment, there are more patterns 200 on the top surface than are needed for positional measurement of the member 50. The member 50 is not for being exposed (that is, it does not have a resist layer on it and so does not react to radiation of the lithographic apparatus). The member 50 comprises at least one measurement pattern for positional measurement as well as an additional pattern 200 to that necessarily present for positional measurement. In one embodiment, the additional pattern 200 (i.e. the plurality of projections 110) surround the at least one measurement pattern.

The member 50 of FIG. 7 may be used to remove contamination from a fluid at least partly contained within a lithography apparatus. The member 50 of FIG. 7 is placed onto a holder for a normal substrate W on a substrate table WT. The fluid to be cleaned is then brought into contact with the cleaning surface 100 of the member 50. Both organic and non-organic contaminant particles 150 fill the recesses 120 between projections 110. A typical recess 120 may have a width of between 8 and 20 µm, may have a depth of between 50 nm and 20 µm and may be several tens to a few hundred µm long (e.g. 50-500 µm long).

The pattern 200 may be any pattern which can be measured by any sensor to detect contamination in the pattern 200. The sensor in the lithographic apparatus may have no other function other than to measure the level of contamination in the pattern 200. However, desirably the sensor is used in the lithographic apparatus for an additional purpose, as described above.

Figure 8:
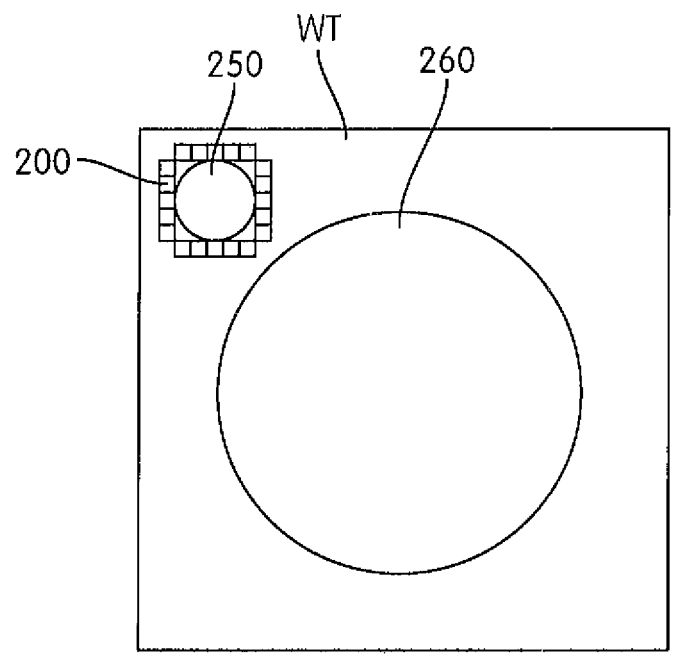
FIG. 8 is a schematic illustration, in plan, of a cleaning surface according to another embodiment of the invention.

FIG. 8 illustrates a further embodiment of the present invention. In FIG. 8 the patterns 200, each comprising a plurality of projections 110, are formed on the top surface of a substrate table WT. The patterns 200 are formed around a sensor 250 on the top surface of the substrate table WT. The top surface of the substrate table WT is provided with a recess 260 in which a substrate or a member such as that illustrated in FIG. 7 can be placed.

During normal use of the lithographic apparatus the sensor 250 may move under the projection system PS, for example to measure a property of the projection beam (e.g. a transmission image sensor (TIS), a spot sensor, etc.). The fluid confinement system IH may ensure that immersion fluid is present between the final element of the projection system PS and the sensor 250. If contaminant particles 150 are present, these can affect the reading of the sensor 250. Therefore, a pattern 200 may be present adjacent the sensor 250, desirably surrounding the sensor 250. The pattern 200 is the same as illustrated in FIGS. 6 and 7. Therefore, the pattern 200 can capture contaminant particles 150, thereby helping to prevent them from reaching the sensor 250. As is described below, the level of contamination in the pattern 200 can also be measured using a sensor in the lithographic apparatus. This may be advantageous because that information may be used in line to make an estimate of the level of contamination in the apparatus as a whole, and in particular of contamination of the sensor 250. Thus, a sensor, such as a sensor which is usually used to align a pattern 200 on a substrate W to be imaged with pattern of a patterning device MA, can be used to determine the degree of contamination of pattern 200 on the top surface of the substrate table WT. This type of pattern 200 is not normally present on the top surface of the substrate table WT. The pattern 200 may be formed in the top surface of the substrate table WT by etching, or may be attached to the substrate table WT, for example by gluing or by using other fastening means.

In an embodiment, the pattern 200 may be defined on the liquid confinement structure IH and/or on the edge of the projection system PS, for example an edge which comes into contact with immersion fluid. In an embodiment, pattern 200 may be formed on the same or other elements in a lithography apparatus which is not an immersion lithographic apparatus. In such an embodiment the pattern 200 is still effective for capturing contaminant particles 150.

Figure 9:
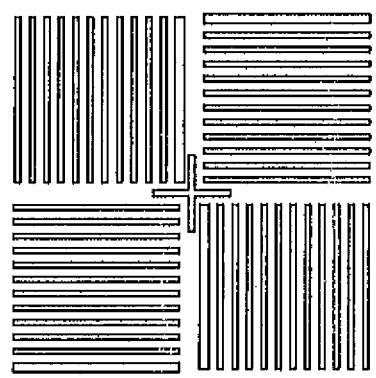
FIG. 9 is a schematic illustration, in plan, of a pattern defined in the cleaning surface.

FIG. 9 illustrates, in plan, a pattern 200 which may be used in an embodiment of the present invention. This is only one embodiment of pattern and any other type of pattern on which contaminant particles can be detected may be used. The pattern of FIG. 9 is comprised of a plurality of projections 110 and recesses 120. The projections may either be the areas in white or the dark areas of FIG. 9.

The pattern 200 of FIG. 9 is a pattern which may be used in conjunction with a similar pattern of a patterning device MA for alignment of a substrate W relative to a patterning device MA. Thus, the pattern of FIG. 9 can be used for x-y positioning of a substrate W relative to a patterning device MA (in a plane perpendicular to the optical axis of the projection system PS).

The pattern 200 of FIG. 9 is made up of quarters. First and third quarters which are diagonally opposed to each other have lines in the y direction. The other two quarters (the second and fourth), which also are diagonally opposed to each other, have lines in the x direction. The x-y plane is in the plane of the paper. The lines in the y direction are spaced by a first certain parameter in the first quarter and by a third certain parameter in the third quarter. The first parameter is smaller than the third parameter. The first parameter in the first quarter may be 16 µm, for example. The third parameter in the third quarter may be 17.6 µm. Similarly, the spacing in the second and fourth quarters in which the lines are aligned up in the x direction have similar certain parameters. That is, the first and fourth parameters are equal and the second and third parameters are equal.

Contamination in recesses of the pattern of FIG. 9 influence parameters measured by the sensor and associated electronics. Therefore, measured parameters by the sensor 400 can be used to determine the presence of contamination in recesses of the pattern of FIG. 9. Alternatively, the parameters can be used to quantify the amount of contamination in the recesses of FIG. 9. This information can be useful in determining how frequently cleaning should be made, in determining the extent of the presence of contamination, whether cleaning needs to be carried out, etc.

One parameter which may be measured is a so called multiple correlation coefficient. The sensor 400 of the alignment system which uses the pattern of FIG. 9 tries to fit a sine wave to the received signal. The multiple correlation coefficient relates to how well the data can be fitted to a sine wave. Deviation from a perfect fit as reflected by the multiple correlation coefficient relates to the amount of contamination.

Another parameter which may be measured is a so called delta shift reading. At an aligned position of a pattern, the first and second parameter of the first and second quarters of lines in a particular direction will not exactly coincide. This is primarily the result of differences in optical paths between the two quarters. The residual difference is the delta shift reading. The delta shift reading can be seen as measuring the asymmetric deformation of the mark.

Figures 10, 11:
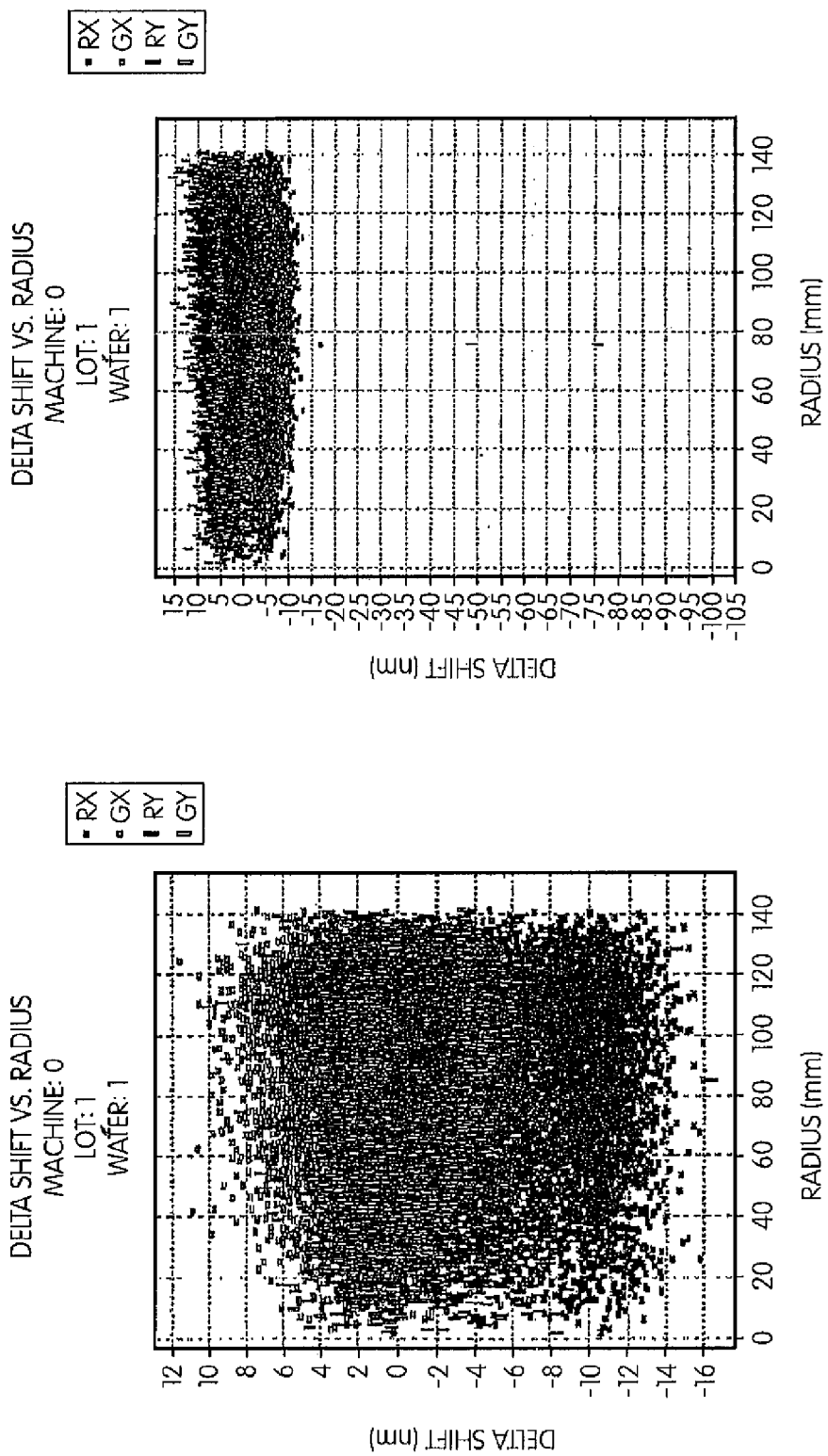
FIG. 10 is a graph showing delta shift vs radius for four members of an embodiment of the present invention prior to use.
FIG. 11 is a graph showing delta shift vs radius for the same members as in FIG. 10 after use for cleaning.

FIG. 10 is a graph showing the delta shift for various radius of four members prior to use for cleaning a lithography apparatus. The members comprise a plurality of patterns such as illustrated in FIG. 7. FIG. 11 are measurements of the delta shift for the same members after cleaning. FIG. 11 shows that after cleaning using the members the contaminated members show a higher delta shift. The delta shift reading is most sensitive to the presence of contamination. Therefore, it is possible to determine the presence of and/or the level of contamination on a pattern 200 by reference to the measured delta shift.

Therefore, as can be seen, parameters measured by a sensor which has as its primary function something other than the detection of contamination, may be used to determine the level of contaminant particles on a pattern 200.

Other sensors may be used. For example, a focal sensor may be used. A focal sensor effectively positions a substrate W in the z direction to help ensure that a patterned beam PB is focused onto the top surface of the substrate W. A pattern used for a focal sensor could be used in place of the pattern of FIG. 9. Parameters measured by the focal sensor and associated electronics may be indicative of the presence and/or amount of contaminant particles. The sensor may therefore be used as a cleanliness sensor. For example, if a layer of contamination is on the pattern 200, the sensor will determine that it is closer to the pattern than it is. Therefore, comparing two measurements taken at a time interval can provide information about the level of contamination.

In an embodiment, a dedicated cleanliness sensor is provided which has no function other than measuring cleanliness of a pattern on a cleaning surface. Such a cleanliness sensor may work on other principles to the alignment or focus sensor described above. The pattern 200 may be the same as or different to the pattern used by an alignment sensor or a focus sensor.

In an embodiment, the sensor may have a function other than measuring alignment of a substrate W relative to a patterning device MA or measuring the focus of a beam.

In an aspect, there is provided a member with a cleaning surface for use in capturing particles in a lithographic apparatus, the cleaning surface comprising a plurality of projections to capture contaminant particles therebetween, wherein the projections are arranged in a pattern to enable a sensor of the lithographic apparatus to detect contaminant particles on the cleaning surface. Desirably the projections cover at least 20% of a whole surface of the member. Desirably the plurality of projections arranged in a pattern are not needed for positional measurement. Desirably the member further comprises a measurement pattern for positional measurement. Desirably the projections arranged in a pattern surround the measurement pattern. Desirably the projections are adjacent a sensor. Desirably the projections substantially surround the sensor. Desirably in use of the lithographic apparatus, the sensor is covered in liquid. Desirably the member is shaped and dimensioned so as to be suitable for handling by a lithographic apparatus. Desirably the member is shaped and dimensioned to be positionable on a substrate table of a lithographic apparatus in place of a substrate. Desirably the cleaning surface does not react to radiation of the lithographic apparatus. Desirably the member comprises or is part of one of the following: (i) a substrate table, (ii) a fluid confinement structure to confine liquid between a projection system and a substrate of a lithographic apparatus, and (iii) a projection system of a lithographic apparatus. Desirably the member is comprised of $SiO_2$. Desirably the projections arranged in a pattern are etched into a material of the member. Desirably the projections arranged in a pattern are suitable for positional measurement using the sensor. Desirably the projections arranged in a pattern are suitable for positional measurement in a plane substantially parallel to the cleaning surface. Desirably the projections arranged in a pattern are suitable for measuring distance of a sensor from the cleaning surface in a direction perpendicularly away from the cleaning surface. Desirably the pattern enables a sensor to determine the amount of contamination captured by the pattern.

In an aspect, use of the member to capture particles in a lithographic apparatus is disclosed.

In an aspect, there is provided a method of removing contamination from a fluid at least partly contained within a lithography apparatus, the method comprising: loading a member comprising a cleaning surface into the apparatus; bringing the member into proximity with the fluid from which contamination is to be removed, such that contamination is captured by the surface; and using a sensor in the apparatus to detect contamination particles on the cleaning surface. Desirably the sensor is a positional sensor for use in the lithography apparatus for measuring the position of a substrate or substrate table relative to a patterning device or projection system. Desirably the lithography apparatus is a lithography projection apparatus. Desirably the cleaning surface comprises a plurality of projections and the projections are arranged in a pattern to enable the sensor to detect contaminant particles on the cleaning surface. Desirably the projections cover at least 20% of a whole surface of the member. Desirably the plurality of projections arranged in a pattern are not needed for positional measurement. Desirably the member further comprises a measurement pattern for positional measurement. Desirably the projections arranged in a pattern surround the measurement pattern. Desirably the projections are adjacent a sensor. Desirably the projections substantially surround the sensor. Desirably in use of the lithographic apparatus, the sensor is covered in liquid. Desirably the projections arranged in a pattern are etched into a material of the member. Desirably the projections arranged in a pattern are suitable for positional measurement using the sensor. Desirably the projections arranged in a pattern are suitable for positional measurement in a plane substantially parallel to the cleaning surface. Desirably the projections arranged in a pattern are suitable for measuring a distance of a sensor from the cleaning surface in a direction perpendicularly away from the cleaning surface. Desirably the pattern enables a sensor to determine the amount of contamination captured by the pattern. Desirably the member is shaped and dimensioned so as to be suitable for handling by a lithographic apparatus. Desirably the member is shaped and dimensioned to be positionable on a substrate table of a lithographic apparatus in place of a substrate. Desirably the cleaning surface does not react to radiation of the lithographic apparatus. Desirably the member comprises or is part of one of the following: (i) a substrate table, (ii) a fluid confinement structure for confining liquid between a projection system and a substrate of a lithographic apparatus; and (iii) a projection system of a lithographic apparatus. Desirably the member is comprised of $SiO_2$.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A member with a cleaning surface for use in capturing particles in a lithographic apparatus, the cleaning surface comprising a plurality of projections to capture contaminant particles therebetween, wherein the projections are arranged in a pattern to enable a sensor of the lithographic apparatus to detect contaminant particles on the cleaning surface, the projections are suitable for positional measurement using the sensor, wherein the member is shaped and dimensioned to be positionable on a substrate table of a lithographic apparatus in place of a radiation-sensitive substrate and the projections cover at least 20% of a whole surface of the member.

2. The member of claim 1, wherein the plurality of projections arranged in a pattern are not needed for positional measurement.

3. The member of claim 1, further comprising a measurement pattern for positional measurement.

4. The member of claim 1, wherein the projections arranged in a pattern are etched into a material of the member.

5. The member of claim 1, wherein the pattern enables a sensor to determine the amount of contamination captured by the pattern.

6. A member with a cleaning surface for use in capturing particles in a lithographic apparatus, the cleaning surface comprising a plurality of projections to capture contaminant particles therebetween, wherein the projections are arranged in a pattern to enable a sensor of the lithographic apparatus to detect contaminant particles on the cleaning surface, wherein the member is shaped and dimensioned to be positionable on a substrate table of a lithographic apparatus in place of a radiation-sensitive substrate, wherein the projections cover at least 20% of a whole surface of the member.

7. The member of claim 6, wherein the plurality of projections arranged in the pattern are not needed for positional measurement.

8. The member of claim 6, further comprising a measurement pattern for positional measurement.

9. A method of removing contamination from a lithography apparatus, the method comprising:
    loading a non-radiation-sensitive member comprising a cleaning surface, into the apparatus and releasably and directly onto a surface of a table of the lithography apparatus, the surface arranged to receive a radiation-sensitive substrate;
    bringing the member into proximity with a liquid in the lithography apparatus, the liquid comprising contamination which is to be removed, such that contamination is captured by the surface; and
    using a sensor in the apparatus to detect contamination particles on the cleaning surface.

10. The method of claim 9, wherein the sensor is a positional sensor for use in the apparatus for measuring the position of a substrate or substrate table relative to a patterning device or projection system.

11. The method of claim 9, wherein the cleaning surface comprises a plurality of projections to capture contaminant particles therebetween.

12. The method of claim 11, wherein the projections are suitable for positional measurement using the sensor.

13. A method of removing contamination from a fluid at least partly contained within a lithography apparatus, the method comprising:
  bringing a member comprising a cleaning surface into proximity with the fluid from which contamination is to be removed, such that contamination is captured by the surface, the cleaning surface adjacent a sensor opening and at least two opposing sides of the sensor opening; and
  using a sensor in the apparatus to detect contamination particles on the cleaning surface,
  wherein the cleaning surface comprises a plurality of projections and the projections are arranged in a pattern to enable the sensor to detect contaminant particles on the cleaning surface.

14. The method of claim 13, wherein the sensor is a positional sensor for use in the apparatus for measuring the position of a substrate or substrate table relative to a patterning device or projection system.

15. The method of claim 13, wherein the plurality of projections arranged in a pattern are not needed for positional measurement.

16. The method of claim 13, wherein the member further comprises a measurement pattern for positional measurement.

17. The method of claim 13, wherein the projections arranged in a pattern are etched into a material of the member.

18. The method of claim 13, wherein the projections arranged in a pattern are suitable for positional measurement using the sensor.

19. The method of claim 13, wherein the pattern enables a sensor to determine the amount of contamination captured by the pattern.

20. The method of claim 13, wherein the member comprises or is part of one of the following: a substrate table, a fluid confinement structure for confining liquid between a projection system and a substrate of a lithographic apparatus; and a projection system of a lithographic apparatus.

21. A lithographic apparatus comprising:
  a movable table;
  a projection system configured to project a desired pattern onto a substrate; and
  a member with a cleaning surface for use in capturing particles in the lithographic apparatus, the cleaning surface comprising a plurality of projections to capture contaminant particles therebetween, wherein the projections are arranged in a pattern to enable a sensor of the lithographic apparatus to detect contaminant particles on the cleaning surface, wherein the cleaning surface is adjacent to a sensor opening on the table and at least two opposing sides of the sensor opening.

22. The apparatus of claim 21, wherein the plurality of projections arranged in the pattern are not needed for positional measurement.

23. The apparatus of claim 21, wherein the member further comprises a measurement pattern for positional measurement.

* * * * *